(12) United States Patent
Yang

(10) Patent No.: US 8,729,930 B2
(45) Date of Patent: May 20, 2014

(54) SUCCESSIVE APPROXIMATION MULTIPLIER-DIVIDER FOR SIGNAL PROCESS AND METHOD FOR SIGNAL PROCESS

(71) Applicant: System General Corp., Taipei Hsien (TW)

(72) Inventor: Ta-Yung Yang, Milpitas, CA (US)

(73) Assignee: System General Corp., Taipei Hsien (TW)

(*) Notice: Subject to any disclaimer, the term of this patent is extended or adjusted under 35 U.S.C. 154(b) by 7 days.

(21) Appl. No.: 13/666,080

(22) Filed: Nov. 1, 2012

(65) Prior Publication Data

US 2013/0106488 A1    May 2, 2013

Related U.S. Application Data

(60) Provisional application No. 61/554,617, filed on Nov. 2, 2011.

(51) Int. Cl.
*H03K 25/00* (2006.01)
*H03K 23/00* (2006.01)
*H03K 21/00* (2006.01)

(52) U.S. Cl.
USPC ........... 327/115; 327/116; 327/117; 327/118; 327/119

(58) Field of Classification Search
USPC .................................................. 327/115.116
See application file for complete search history.

(56) References Cited

U.S. PATENT DOCUMENTS

| | | | | |
|---|---|---|---|---|
| 6,104,774 A | * | 8/2000 | Yokomizo | 377/47 |
| 6,351,756 B1 | * | 2/2002 | Taniyoshi | 708/103 |
| 2004/0095169 A1 | * | 5/2004 | Kaneko | 327/119 |
| 2013/0106488 A1 | * | 5/2013 | Yang | 327/356 |

* cited by examiner

*Primary Examiner* — Ryan Jager
(74) *Attorney, Agent, or Firm* — Rosenberg, Klein & Lee

(57) ABSTRACT

A multiplier-divider circuit for signal process according to the present invention comprises a digital-to-analog converter, a first counter, a second counter, an oscillation circuit, and a control-logic apparatus. The digital-to-analog converter generates an output signal of the multiplier-divider circuit in accordance with the value of an input signal and a first signal. The first counter generates the first signal in response to a clock signal and the duty cycle of the input signal. The second counter generates a second signal in response to the clock signal and the period of the input signal. The oscillation circuit generates the clock signal in accordance with a third signal. The control-logic apparatus generates the third signal in response to the second signal and a constant. The first signal is correlated to the duty cycle of the input signal. The second signal is correlated to the period of the input signal.

14 Claims, 3 Drawing Sheets

US 8,729,930 B2

SUCCESSIVE APPROXIMATION MULTIPLIER-DIVIDER FOR SIGNAL PROCESS AND METHOD FOR SIGNAL PROCESS

REFERENCE TO RELATED APPLICATION

This Application is based on Provisional Patent Application Ser. No. 61/554,617, filed 2 Nov. 2011, currently pending.

BACKGROUND OF THE INVENTION

1. Field of the Invention

The present invention relates to a multiplier-divider, and more particularly, to the multiplier-divider for signal process.

2. Description of Related Art

The traditional multiplier-divider requires an analog-to-digital converter, digital multiplier/divider circuits and a digital-to-analog converter for signal process. Therefore, the circuit of the traditional multiplier-divider is complex and large. Accordingly, the present invention provides a method and circuit of a successive approximation multiplier-divider that is a simple and small size and lower cost solution.

SUMMARY OF THE INVENTION

The objective of the present invention is to provide a multiplier-divider circuit. The multiplier-divider circuit is simple and small size and lower cost.

The present invention provides a multiplier-divider circuit for signal process. The multiplier-divider circuit comprises a digital-to-analog converter, a first counter, a second counter, an oscillation circuit, and a control-logic apparatus. The digital-to-analog converter generates an output signal of the multiplier-divider circuit in accordance with the value of an input signal and a first signal. The first counter generates the first signal in response to a clock signal and the duty cycle of the input signal. The second counter generates a second signal in response to the clock signal and the period of the input signal. The oscillation circuit generates the clock signal in accordance with a third signal. The control-logic apparatus generates the third signal in response to the second signal and a constant. The first signal is correlated to the duty cycle of the input signal. The second signal is correlated to the period of the input signal.

BRIEF DESCRIPTION OF THE DRAWINGS

The invention can be more fully understood by reading the subsequent detailed description and examples with references made to the accompanying drawings, wherein.

DESCRIPTION OF THE PREFERRED EMBODIMENTS

Figure 1:
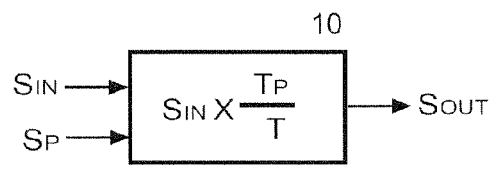
FIG. 1 is a circuit block of the successive approximation multiplier-divider circuit in accordance with the present invention.
Figure 3:
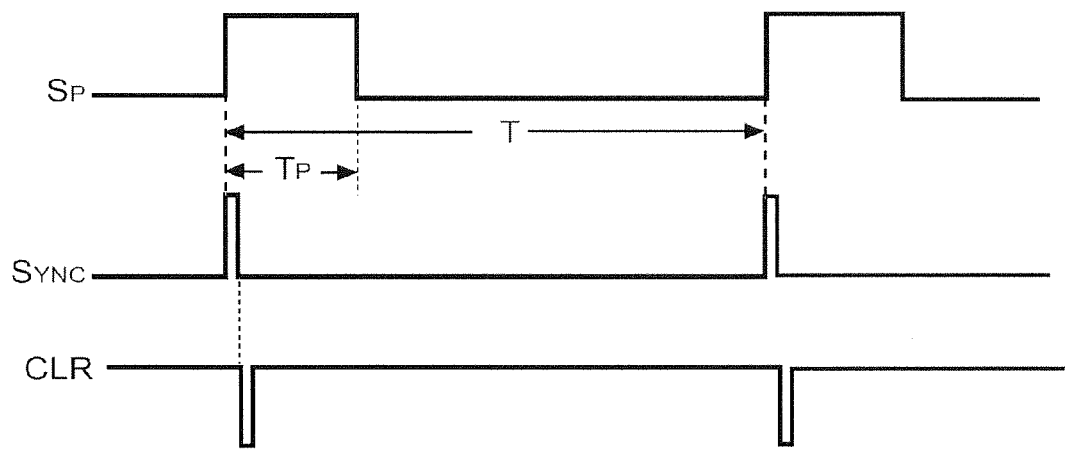
FIG. 3 shows the signal waveforms of the input signal $S_P$, the signal $S_{YNC}$ and the signal CLR in accordance with the present invention.

FIG. 1 is a circuit block of the successive approximation multiplier-divider circuit in accordance with the present invention. The output of the successive approximation multiplier-divider circuit 10 can be expressed by, $$S_{OUT} = S_{IN} \times \frac{T_P}{T} \quad (1)$$

Wherein $S_{OUT}$ is an output signal of the successive approximation multiplier-divider circuit 10; $S_{IN}$ is the amplitude of an input signal $S_P$; $T_P$ is duty cycle of the input signal $S_P$ (as shown in FIG. 3); T is the period of the input signal $S_P$ (as shown in FIG. 3). The input signal $S_P$ and the output signal $S_{OUT}$ are analog signals.

Figure 2:
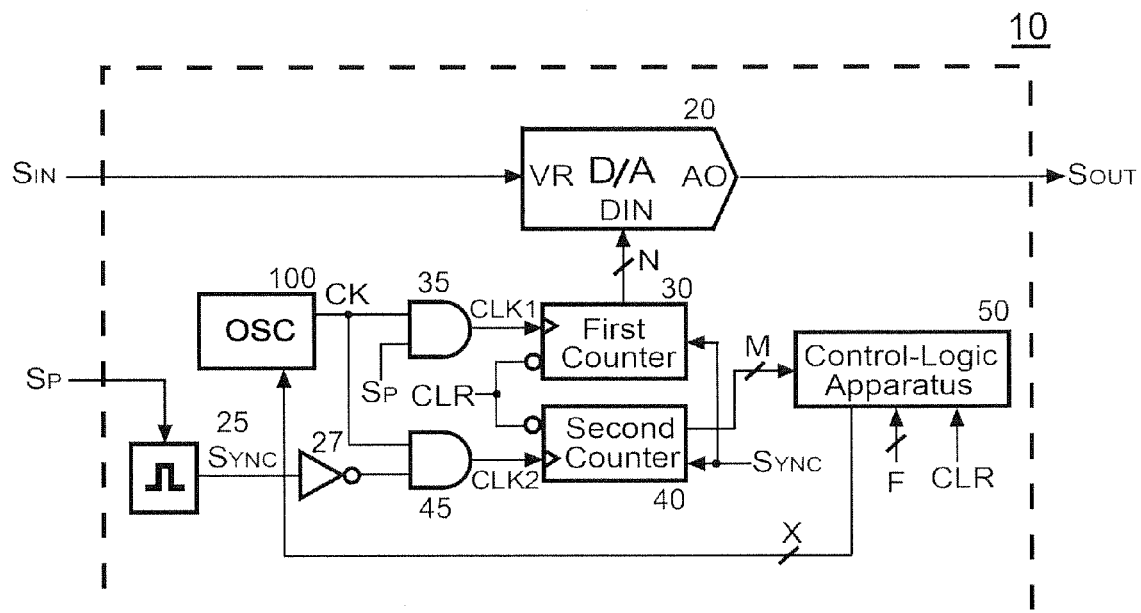
FIG. 2 is a circuit diagram of a preferred embodiment of the successive approximation multiplier-divider circuit in accordance with the present invention.

FIG. 2 is a circuit diagram of a preferred embodiment of the successive approximation multiplier-divider circuit 10 in accordance with the present invention. The successive approximation multiplier-divider circuit 10 comprises a digital-to-analog converter (D/A) 20, a first counter 30, a second counter 40, an oscillation circuit (OSC) 100 and a control-logic apparatus 50.

The successive approximation multiplier-divider circuit 10 receives the input signal $S_P$ and the input signal $S_{IN}$ (the amplitude of the input signal $S_P$) for generating the output signal $S_{OUT}$. The output signal $S_{OUT}$ is generated at an output terminal AO of the digital-to-analog converter 20. The output signal $S_{OUT}$ of the digital-to-analog converter 20 is determined by a reference input terminal (maximum value input terminal) VR and a digital input terminal DIN of the digital-to-analog converter 20. The maximum value input terminal VR receives the input signal $S_{IN}$ (the amplitude of the input signal $S_P$). The digital input terminal DIN receives a first signal N. In other words, the output signal $S_{OUT}$ is determined by the input signal $S_{IN}$ and the first signal N. Therefore, the equation (1) can be expressed as, $$S_{OUT} = V_R \times \frac{n}{N_{MAX}} \quad (2)$$

$$S_{OUT} = S_{IN} \times \frac{n}{N_{MAX}} \quad (3)$$

wherein $V_R$ is a signal received by the maximum value input terminal VR of the digital-to-analog converter 20; n is the value of the first signal N; $N_{MAX}$ is the maximum value of the first signal N; $N_{MAX}$ is equivalent to the full scale of the digital input of the digital-to-analog converter 20.

The first counter 30 is coupled to the digital input terminal DIN of the digital-to-analog converter 20 and the oscillation circuit 100. The first counter 30 generates the first signal N in response to a clock signal CK generated by the oscillation circuit 100 and the duty cycle of the input signal $S_P$. The value of the first signal N will be increased in response to the increase of the frequency of the clock signal CK and/or the increase of the duty cycle of the input signal $S_P$.

The first counter 30 further receives a signal $S_{YNC}$ and a signal CLR. The value of the first signal N will be latched in response to the enable of the signal $S_{YNC}$. The value of the first signal N will be reset in response to the signal CLR. The oscillation circuit 100 is coupled to the first counter 30, the second counter 40 and the control-logic apparatus 50. The oscillation circuit 100 generates the clock signal CK in accordance with a third signal X generated by the control-logic apparatus 50. The clock signal CK of the oscillation circuit 100 will be regulated in accordance with the feedback (the third signal X) of the control-logic apparatus 50. The second counter 40 is coupled to the oscillation circuit 100 and the control-logic apparatus 50.

The second counter 40 generates a second signal M in response to the clock signal CK generated by the oscillation circuit 100 and the period of the input signal $S_P$. The second signal M is correlated to the period of the input signal $S_P$. The value of the second signal M will be increased in response to the increase of the frequency of the clock signal CK and/or the increase of the period of the input signal $S_P$. The second counter 40 further receives the signal $S_{YNC}$ and the signal CLR. The value of the second signal M will be latched in response to the enable of the signal $S_{YNC}$. The value of the second signal M will be reset in response to the signal CLR. The control-logic apparatus 50 will regulate the clock signal CK and lock the value of the second signal M generated by the second counter 40. The second signal M is further coupled to the control-logic apparatus 50. The control-logic apparatus 50 generates the third signal X in accordance with the comparison of the second signal M and a digital-value F. The digital-value F is a constant value, and it is related to the maximum value ($N_{MAX}$) of the first signal N.

The first signal N, the second signal M and the third signal X are digital signals. The first signal N, the second signal M and the third signal X are formed by at lest one digital signal respectively. The successive approximation multiplier-divider circuit 10 future comprises AND gates 35 and 45, a pulse generator 25 and an inverter 27. The AND gate 35 is coupled to the oscillation circuit 100 and the first counter 30. An input terminal of the AND gate 35 receives the clock signal CK generated by the oscillation circuit 100. The other input terminal of the AND gate 35 receives the input signal $S_P$. An output terminal of the AND gate 35 is coupled to a clock-input terminal of the first counter 30 and outputs a clock-input signal CLK1. That is to say, the clock-input terminal of the first counter 30 is drove by the clock signal CK and the input signal $S_P$.

The AND gate 45 is coupled to the oscillation circuit 100, the second counter 40, the inverter 27 and the plus generator 25 through the inverter 27. The input signal $S_P$ is coupled to generate the signal $S_{YNC}$ via the pulse generator 25. In other words, the pulse generator 25 generates the signal $S_{YNC}$ in response to the input signal $S_P$. The signal $S_{YNC}$ is generated in response to the rising edge of the input signal $S_P$. Therefore, the signal $S_{YNC}$ indicates the period of the input signal $S_P$. An input terminal of the AND gate 45 receives the signal $S_{YNC}$ through the inverter 27. The other input terminal of the AND gate 45 receives the clock signal CK generated by the oscillation circuit 100. An output terminal of the AND gate 45 is coupled to a clock-input terminal of the second counter 40 and outputs a clock-input signal CLK2. That is to say, the clock-input terminal of the second counter 40 is drove by the clock signal CK and the input signal $S_P$. The bit-length of the second counter 40 is more than the bit-length of the first counter 30. The signal $S_{YNC}$ and the signal CLR are coupled to the counters 30 and 40 for the latch and the clear of the data.

FIG. 3 shows the signal waveforms of the input signal $S_P$, the signal $S_{YNC}$ and the signal CLR in accordance with the present invention. The signal $S_{YNC}$ is generated (logic-high level) in response to the rising edge of the input signal $S_P$. The signal CLR is generated (logic-low level) after the disable (logic-low level) of the signal $S_{YNC}$.

Figure 4:
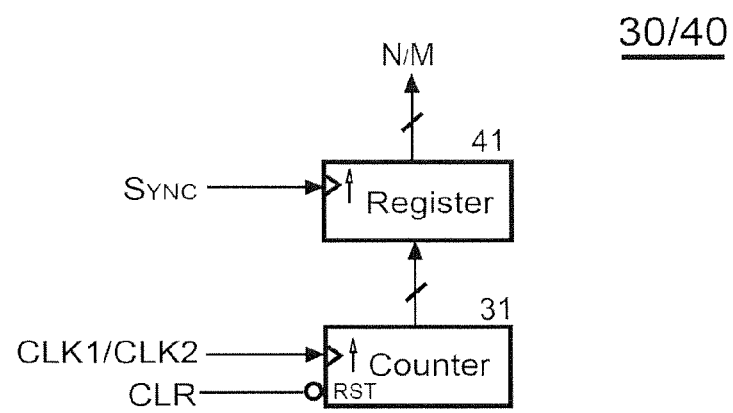
FIG. 4 shows a circuit diagram of a preferred embodiment of the first counter and the second counter in accordance with the present invention.

FIG. 4 shows a circuit diagram of a preferred embodiment of the first counter 30 and the second counter 40 in accordance with the present invention. The first counter 30 and the second counter 40 can be implemented by a counter 31 and a register 41. The counter 31 receives the clock input signal CLK1 and the signal CLR or the clock input signal CLK2 and the signal CLR. The counter 31 is a binary counter. The register 41 receives the signal $S_{YNC}$. The counter 31 will increase its output value in response to its clock input signal CLK1 or CLK2. The output value of the counter 31 will be latched into the register 41 in response to the enable of the signal $S_{YNC}$. The output terminal of the register 41 generates the first signal N or the second signal M. The output value of the counter 31 will be reset in response to the signal CLR.

Figure 5:
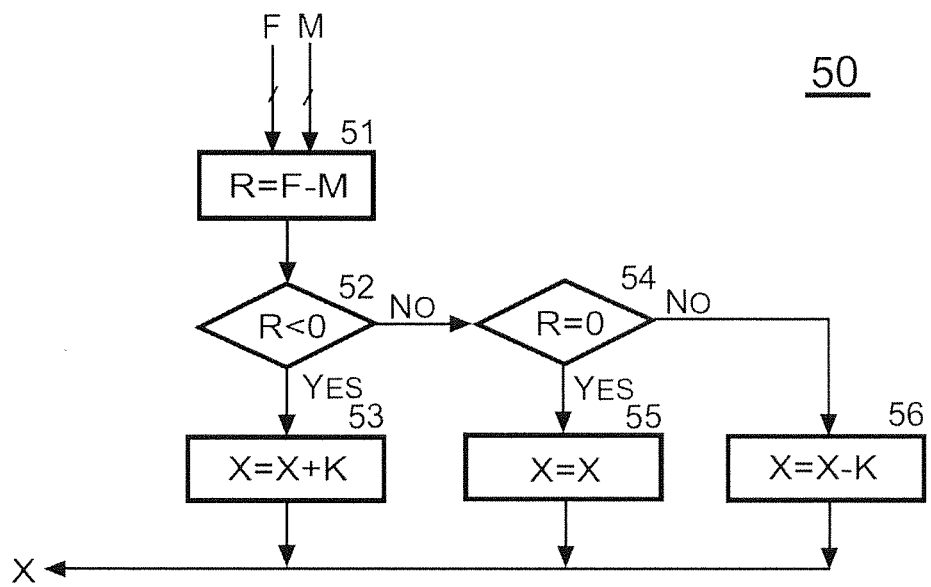
FIG. 5 is a preferred embodiment of the control-logic apparatus in accordance with the present invention.

FIG. 5 is a preferred embodiment of the control-logic apparatus 50 in accordance with the present invention. The control-logic apparatus 50 is operated during the enable period (the logic-low period shown in FIG. 3) of the signal CLR. An apparatus 51 generates a data R by subtracting the second signal M from the digital-value F (R=F−M). An apparatus 52 is utilized to compares the data R with the zero (0). If the value of the data R is smaller than the zero (R<0), then the value of the third signal X will be increased by an apparatus 53 (X=X+K; K can be a constant or a variable). If the value of the data R is not smaller than the zero, then an apparatus 54 will operate and check the data R.

The apparatus 54 is utilized to check whether the value of the data R is equal to the zero. If the value of the data R is equal to the zero (R=0), then the value of the third signal X will be keep without the change as shown in an apparatus 55 (X=X), and the frequency of the clock signal CK will be keep without the change. Further, the value of the second signal M generated by the second counter 40 will be locked. If the value of the data R is larger than the zero (R>0), then the value of the third signal X will be decreased (X=X−K) by an apparatus 56. Therefore, the value of the third signal X is increased to increase the frequency of the clock signal CK if the value of second signal M is more than the digital-value F. The value of the third signal X will be decreased to decrease the frequency of the clock signal CK if the value of second signal M is smaller than the digital-value F.

Figure 6:
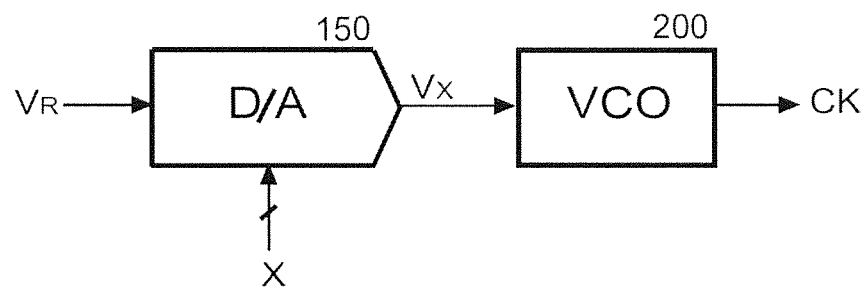
FIG. 6 shows a circuit diagram of a preferred embodiment of the oscillation circuit in accordance with the present invention.

FIG. 6 shows a circuit diagram of a preferred embodiment of the oscillation circuit 100 in accordance with the present invention. A digital-to-analog converter (D/A) 150 generates an analog signal $V_X$ in accordance with the third signal X. The digital-to-analog converter 150 further receives a signal $V_R$. A voltage-controlled-oscillator (VCO) 200 generates the clock signal CK in accordance with the analog signal $V_X$. Consequently, the clock signal CK of the oscillation circuit 100 will be regulated in accordance with the feedback (the third signal X) of the control-logic apparatus 50 (as shown in FIG. 2). The control-logic apparatus 50 will regulate the clock signal CK and lock the value of the second signal M generated by the second counter 40. The value of the second signal M will be locked as the maximum value ($N_{MAX}$) of the first signal N when the period of the input signal $S_P$ is changed. The maximum value $N_{MAX}$ is shown in equation 3. Once the value of the second signal M is regulated to be the maximum value ($N_{MAX}$) of the first signal N, the value ($N_{MAX}$) of the first signal N will be equivalent to the period (T) of the input signal $S_P$, and the value (n) of the first signal N will be correlated to the duty cycle ($T_P$) of the input signal $S_P$. Therefore, as shown in the equation (1), the output signal $S_{OUT}$ is equivalent to the value of the input signal $S_{IN}$ multiplies the duty cycle $T_P$ of the input signal $S_P$. Besides, the output signal $S_{OUT}$ is equivalent to the value of the input signal $S_{IN}$ divides the period T of the input signal $S_P$.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A multiplier-divider circuit for signal process, comprising:
    a digital-to-analog converter generating an output signal of the multiplier-divider circuit in accordance with the value of an input signal and a first signal;
    a first counter generating the first signal in response to a clock signal and the duty cycle of the input signal;
    a second counter generating a second signal in response to the clock signal and the period of the input signal;
    an oscillation circuit generating the clock signal in accordance with a third signal; and
    a control-logic apparatus generating the third signal in response to the second signal and a constant;
    wherein the first signal is correlated to the duty cycle of the input signal; the second signal is correlated to the period of the input signal.

2. The circuit as claimed in claim 1, wherein the constant is related to a full scale value of the first signal.

3. The circuit as claimed in claim 1, wherein the control-logic apparatus will increase the frequency of the clock signal if the second signal is more than the constant.

4. The circuit as claimed in claim 1, wherein the frequency of the clock signal is kept If the second signal is equal to the constant.

5. The circuit as claimed in claim 1, wherein the oscillation circuit comprises a voltage-controlled-oscillator.

6. The circuit as claimed in claim 1, wherein the output signal of the multiplier-divider circuit is equivalent to the value of the input signal multiplies the duty cycle of the input signal.

7. The circuit as claimed in claim 1, wherein the output signal of the multiplier-divider circuit is equivalent to the value of the input signal divides the period of the input signal.

8. The circuit as claimed in claim 1, wherein the first signal, the second signal, and the third signal X are digital signals.

9. A method for signal process, comprising:
    generating a first signal in response to a clock signal and the duty cycle of an input signal;
    generating an analog output signal in accordance with the value of the input signal and the first signal;
    generating a second signal in response to the clock signal and the period of the input signal;
    generating a third signal in response to the second signal; and
    controlling the clock signal in accordance with the third signal;
    wherein the first signal is correlated to the duty cycle of the input signal; the second signal is correlated to the period of the input signal.

10. The method as claimed in claim 9, further comprising a constant related to a full scale value of the first signal for generating the third signal.

11. The method as claimed in claim 10, wherein the third signal will be increased to increase the frequency of the clock signal when the second signal is more than the constant.

12. The method as claimed in claim 9, wherein the analog output signal is equivalent to the value of the input signal multiplies the duty cycle of the input signal.

13. The method as claimed in claim 9, wherein the analog output signal is equivalent to the value of the input signal divides the period of the input signal.

14. The method as claimed in claim 9, wherein the input signal is an analog signal.

* * * * *